United States Patent
Awatsu et al.

(10) Patent No.: US 11,359,940 B2
(45) Date of Patent: Jun. 14, 2022

(54) SENSOR APPARATUS AND SENSOR SYSTEM

(71) Applicant: Asahi Kasei Microdevices Corporation, Tokyo (JP)

(72) Inventors: Masao Awatsu, Tokyo (JP); Hirofumi Iwasaki, Tokyo (JP); Teppei Hayashi, Tokyo (JP)

(73) Assignee: Asahi Kasei Microdevices Corporation, Tokyo (JP)

( * ) Notice: Subject to any disclaimer, the term of this patent is extended or adjusted under 35 U.S.C. 154(b) by 0 days.

(21) Appl. No.: 17/140,131

(22) Filed: Jan. 3, 2021

(65) Prior Publication Data

US 2021/0123776 A1  Apr. 29, 2021

Related U.S. Application Data

(63) Continuation of application No. 16/286,509, filed on Feb. 26, 2019, now abandoned.

(30) Foreign Application Priority Data

Feb. 28, 2018 (JP) .............................. JP2018-034047

(51) Int. Cl.
*G01D 7/00* (2006.01)
*G01D 11/00* (2006.01)
(Continued)

(52) U.S. Cl.
CPC ............... *G01D 11/00* (2013.01); *G01D 7/00* (2013.01); *G01R 31/40* (2013.01); *H01M 8/16* (2013.01);
(Continued)

(58) Field of Classification Search
CPC ......... G01D 11/00; G01D 7/00; H02M 3/156; H02M 1/08; H02M 3/1563; H02M 3/07;
(Continued)

(56) References Cited

U.S. PATENT DOCUMENTS

| 3,228,799 A | 1/1966 | Rohrback |
| 8,232,761 B1 | 7/2012 | Thivierge |
| 2010/0081014 A1 | 4/2010 | Tyce |
| 2010/0119879 A1 | 5/2010 | Girguls |

(Continued)

FOREIGN PATENT DOCUMENTS

| JP | 2007181278 A | 7/2007 |
| JP | 2010033824 A | 2/2010 |

(Continued)

OTHER PUBLICATIONS

U.S. Appl. No. 16/286,509, filed Feb. 26, 2019, to Masao Awatsu et al.

*Primary Examiner* — Robert R Raevis

(57) ABSTRACT

To provide a sensor apparatus and sensor system using a low-power input source such as a microbial fuel cell, provided is a sensor apparatus including a microbial fuel cell; a boosting DC-DC circuit that operates based on an input voltage from the microbial fuel cell and boosts the input voltage; a power storage element that stores power output from the boosting DC-DC circuit; and a sensor element that operates based on power output from the power storage element, as well as a sensor system that includes this sensor apparatus and a wireless communication apparatus.

14 Claims, 16 Drawing Sheets

(51) Int. Cl.
  *H02M 3/156*   (2006.01)
  *G01R 31/40*   (2020.01)
  *H01M 8/16*   (2006.01)
  *H02M 1/08*   (2006.01)
  *H02M 3/07*   (2006.01)

(52) U.S. Cl.
  CPC .............. *H02M 1/08* (2013.01); *H02M 3/156* (2013.01); *H02M 3/1563* (2013.01); *H01M 2250/10* (2013.01); *H02M 3/07* (2013.01)

(58) Field of Classification Search
  CPC .... H02M 1/0022; H02M 3/072; G01R 31/40; H01M 8/16; H01M 2250/10; H01M 2250/20; H01M 2250/40
  USPC ...... 73/866.1, 114.58, 114.59; 324/433, 522, 324/713, 111; 340/455, 635–636.2, 540, 340/577, 584, 595–599, 601, 603
  See application file for complete search history.

(56) References Cited

U.S. PATENT DOCUMENTS

| | | |
|---|---|---|
| 2011/0241625 A1* | 10/2011 | LoCascio ................ H02J 7/00 320/140 |
| 2012/0323092 A1 | 12/2012 | Jain |
| 2015/0128733 A1 | 5/2015 | Taylor |
| 2015/0357666 A1 | 12/2015 | Arias-Thode |
| 2018/0246053 A1 | 8/2018 | Togo |
| 2018/0269511 A1 | 9/2018 | Togo |
| 2018/0270632 A1 | 9/2018 | Kaneeda |
| 2019/0348731 A1 | 11/2019 | Innes |

FOREIGN PATENT DOCUMENTS

| | | |
|---|---|---|
| JP | 2013084541 A | 5/2013 |
| JP | 2015009210 A | 1/2015 |
| JP | 2015210968 A | 11/2015 |
| JP | 2016054053 A | 4/2016 |
| JP | 2017041742 A | 2/2017 |
| JP | 2017047367 A | 3/2017 |
| WO | 2015045687 A1 | 4/2015 |

* cited by examiner

SENSOR APPARATUS AND SENSOR SYSTEM

CROSS-REFERENCE TO RELATED APPLICATIONS

This application is a continuation application of U.S. patent application Ser. No. 16/286,509, filed on Feb. 26, 2019, which claims priority to Japanese Patent Application No. 2018-034047 filed on Feb. 28, 2018, the contents of each of which are hereby incorporated herein by reference in their entirety.

BACKGROUND

1. Technical Field

The present invention relates to a sensor apparatus and a sensor system.

2. Related Art

An environmental information acquisition system with an independent power supply is known, as shown in Patent Document 1, for example. However, the system of Patent Document 1 uses solar power, and therefore the operation of this system is easily affected by the time of day and weather conditions. On the other hand, a microbial fuel cell that uses the metabolic capabilities of microorganisms is known, as shown in Patent Document 2, for example. The microbial fuel cell operates stably during day and night without being affected by the time of day or weather, but does not generate enough power to operate the environmental information acquisition system. Patent Document 3 describes increasing the power generation amount by forming microbial fuel cells as a multistage unit, but the configuration of such an apparatus is complicated and physically large, and the manufacturing cost thereof would increase.

Patent Document 1: Japanese Patent Application Publication No. 2007-181278
Patent Document 2: Japanese Patent Application Publication No. 2016-54053
Patent Document 3: Japanese Patent Application Publication No. 2010-33824

In light of the above conventional technology, it is an objective of the present invention to provide a sensor apparatus and a sensor system that use a low-power independent power supply such as a microbial fuel cell.

SUMMARY

To solve the above problems, according to a first aspect of the present invention, provided is a sensor apparatus comprising a microbial fuel cell; a boosting DC-DC circuit that is operated by an input voltage from the microbial fuel cell and boosts the input voltage; a power storage element that stores power output from the boosting DC-DC circuit; and a sensor element that is operated by power output from the power storage element.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
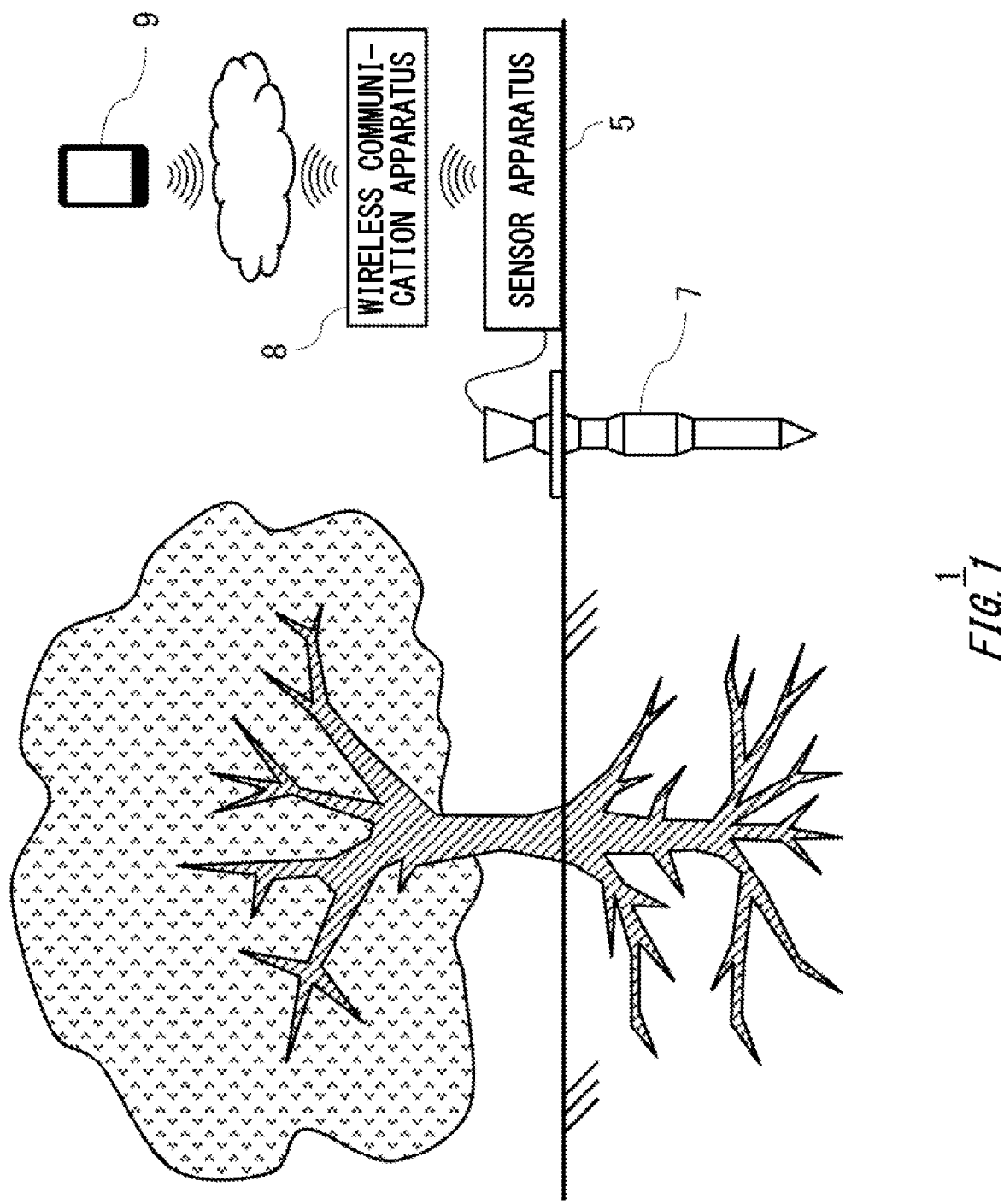
FIG. 1 shows an example of a configuration of a sensor system according to the present embodiment.

FIG. 1 shows an example of a configuration of a sensor system 1 according to the present embodiment. The sensor system 1 includes a sensor apparatus 5 that senses environmental information and a wireless communication apparatus 8 that communicates with the sensor apparatus 5, thereby providing the environmental information sensed by the sensor apparatus 5 to the outside.

The sensor apparatus 5 senses environmental information such as temperature and humidity using a sensor element. The sensor apparatus 5 may include a microbial fuel cell 7 as a power supply. For example, the microbial fuel cell 7 may use anaerobic current-generating bacteria in soil. As an example, the sensor apparatus 5 is arranged outdoors or indoors at locations where soil is present, such as forests, fields, residential lots, vacant lots, rooftops or balconies of buildings, or planters. The microbial fuel cell 7 is inserted into the soil to generate power, and supplies the power to the sensor apparatus 5. The details of the sensor apparatus 5 are described further below.

The sensor apparatus 5 may include an energy harvesting power supply that uses energy harvesting, in addition to or instead of the microbial fuel cell 7. Examples of energy harvesting include photoelectric power generation using at least one type of light energy such as sunlight, an incandescent lamp, a fluorescent lamp, or an LED as an energy source; thermoelectric power generation using at least one type of thermal energy such as heat generated by a machine and environmental temperature as an energy source; vibration power generation with at least one of vibration generated by a machine and vibration of a bridge, road, building, house, rail, human, animal, ball screw, linear guide or the like as an energy source; and electromagnetic wave power generation using the energy of electromagnetic waves, radio waves, or the like as energy. In the present specification, the energy harvesting power supply may include a microbial fuel cell.

The sensor system 1 may include a plurality of the sensor apparatuses 5. In this way, the sensor system 1 can sense environmental information at a plurality of geographical locations and/or a plurality of types of environmental information.

The wireless communication apparatus 8 receives the sensing results of the sensor element from the sensor apparatus 5, via wireless communication, and transmits the sensing results to a communication network (e.g. the Internet). In this way, a terminal 9 (e.g. a personal computer, server computer, smartphone, mobile terminal, and/or the like) connected to the communication network can acquire the environmental information sensed by the sensor apparatus 5, via the communication network.

The wireless communication apparatus 8 may communicate with the sensor apparatus 5 using short-range wireless communication or the like, such as Bluetooth (Registered Trademark), and may be connected to the communication network using medium- and long-range wireless communication such as 3G, 4G, LTE, LPWA, and/or Wi-Fi. A single wireless communication apparatus 8 may handle the communication with all of the sensor apparatuses 5. Instead, the sensor system 1 may include a plurality of the wireless communication apparatuses 8, and the communication with all of the sensor apparatuses 5 may be shared among the plurality of wireless communication apparatuses 8. As an example, the wireless communication apparatus 8 may be installed indoors and operate by receiving power from a stable power supply such as a commercial power supply.

The above describes a case in which the sensor apparatus 5 communicates with only the wireless communication apparatus 8, but other embodiments may be adopted. For example, the sensor apparatus 5 may be directly connected to a communication network such as the Internet. Alternatively the sensor apparatus 5 may serve as an intermediary for communication between another sensor apparatus 5 and the wireless communication apparatus 8. For example, one sensor apparatus 5 may receive the sensing results from another sensor apparatus 5 via short-range wireless communication or the like, and transmit these sensing results along with its own sensing results to the wireless communication apparatus 8. In this way, it is possible to form an environmental information sensing network with the sensor apparatuses 5, and to stably realize acquisition of a wide range of environmental information with an independent power source.

Figure 2:
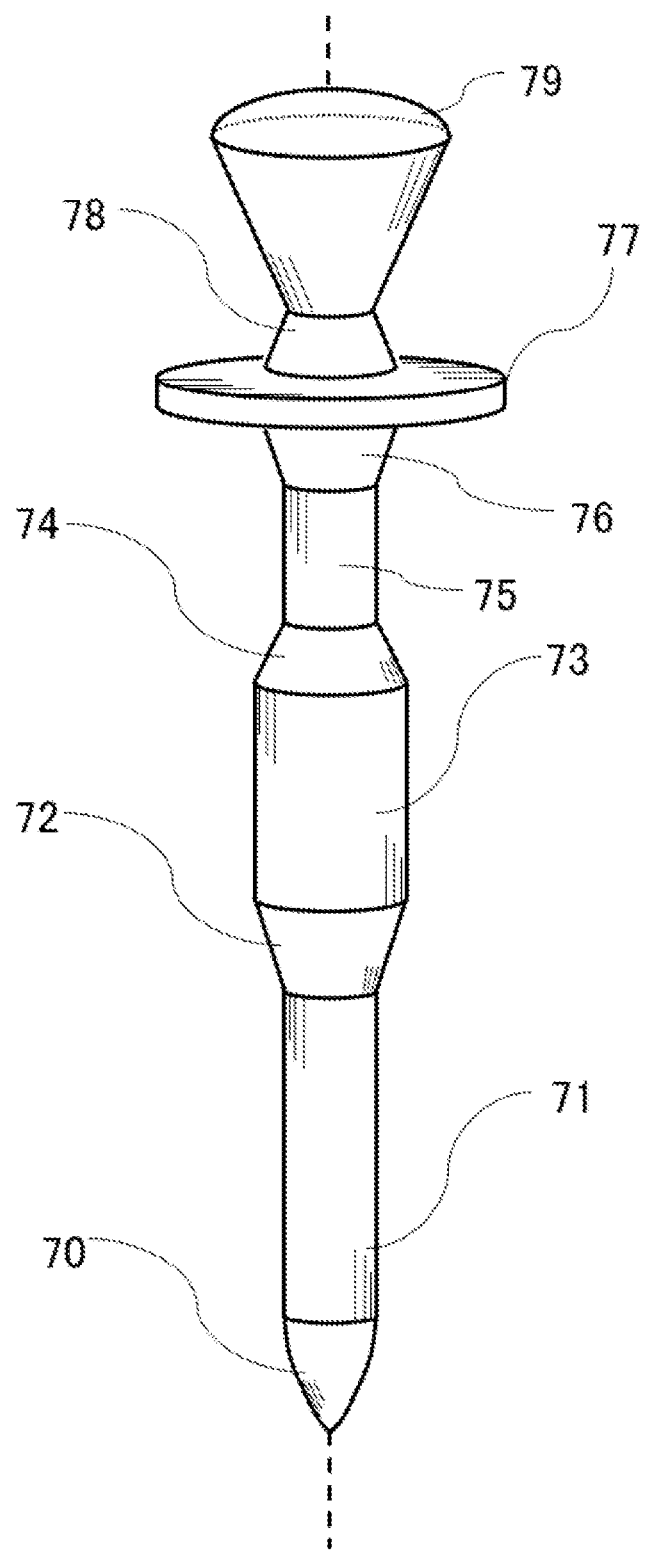
FIG. 2 shows an example of a configuration of the microbial fuel cell.

FIG. 2 shows an example of a configuration of the microbial fuel cell. As shown in the drawing, the microbial fuel cell 7 has a long and thin stake shape enabling easy insertion into soil. This stake shape may be any one of a tube shape, a cylindrical pillar shape, a cone shape, a polygonal pillar shape, and a polygonal cone shape. The microbial fuel cell 7 may include a tip portion 70, an anode electrode 71, a first connecting member 72, a first rod-shaped member 73, a second connecting member 74, a second rod-shaped member 75, a third connecting member 76, a cathode electrode 77, an electronic circuit section 78, and a display section 79.

The tip portion 70 forms one end of the stake shape, and may have a shape that narrows toward the tip in order to facilitate insertion into the soil. The very tip of the tip portion 70 may be formed with a pointed shape to provide easy penetration into the ground, or with a semispherical shape rounded for the sake of safety. The tip portion 70 may be formed of a hard material to be easily inserted into the ground. For example, the tip portion 70 may be formed of resin, ceramic, metal, or the like.

The anode electrode 71 is attached to one end side of the stake shape, adjacent to the tip portion 70. The anode electrode 71 functions as an anode of the microbial fuel cell 7. For example, the anode electrode 71 is installed in an anaerobic environment and recovers electrons generated when organic matter in the soil is oxidatively decomposed by anaerobic current-generating bacteria. The anode electrode 71 may be a tube-shaped conductive body (e.g. metal), or may be a tube-shaped base (e.g. resin) covered by a conductive material (e.g. metal or carbon fiber material). The actual electrode portion may be provided on only a portion of the anode electrode 71 shaped as a long tube. Alternatively, the tip portion 70 and the anode electrode 71 may be formed integrally, and the tip portion 70 may also function as a portion of the anode electrode 71.

The first connecting member 72 connects the anode electrode 71 and the first rod-shaped member 73. The first connecting member 72 may connect the anode electrode 71 and the first rod-shaped member 73 using a screw, a fitting, an adhesive, or another fixing means. The first connecting member 72 may be formed of resin, ceramic, metal, or the like, for example.

The first rod-shaped member 73 adjusts the depth in the soil at which the anode electrode 71 is installed. For example, a plurality of first rod-shaped member 73 with different lengths may be prepared, and a first rod-shaped member 73 with a suitable length can be selected such that the anode electrode 71 is installed at a depth causing good power generation efficiency. The length of the first rod-shaped member 73 itself may be adjustable. For example, the first rod-shaped member 73 may have a structure in which one rod is inserted into another tube-shaped rod and these rods are connected to each other by a screw or the like, and the first rod-shaped member 73 may be extended and contracted by rotating the inner rod. The first rod-shaped member 73 may be formed of resin, ceramic, metal, or the like, for example. As an example, the first rod-shaped member 73 may be a polyvinyl chloride pipe or wood.

The second connecting member 74 connects the first rod-shaped member 73 and the second rod-shaped member 75. The second connecting member 74 may connect the first rod-shaped member 73 and the second rod-shaped member 75 using a screw, a fitting, an adhesive, or another fixing means. The second connecting member 74 may be formed of resin, ceramic, metal, or the like, for example.

The second rod-shaped member 75 adjusts the depth in the soil at which the anode electrode 71 is installed. In the same manner as the first rod-shaped member 73, a plurality of second rod-shaped member 75 with different lengths may be prepared, or the second rod-shaped member 75 may be able to extend and contract. Instead, the second rod-shaped member 75 may have a fixed length. The second rod-shaped member 75 may be formed of resin, ceramic, metal, or the like, for example. As an example, the second rod-shaped member 75 may be a polyvinyl chloride pipe or wood.

The third connecting member 76 connects the second rod-shaped member 75 and the cathode electrode 77. The third connecting member 76 may connect the second rod-shaped member 75 and the cathode electrode 77 using a screw, a fitting, an adhesive, or another fixing means. The third connecting member 76 may be formed of resin, ceramic, metal, or the like, for example.

The cathode electrode 77 is connected to the third connecting member 76 and provided on the other end side of the stake shape. The cathode electrode 77 functions as a cathode of the microbial fuel cell 7. For example, the cathode electrode 77 contacts at least one of air, soil (ground surface), and water (a lake, river, water tank, or sea), and provides electrons and $H^+$ to the oxygen in the air to generate water. The cathode electrode 77 may have a flat surface portion that is orthogonal to the longitudinal direction of the stake shape. For example, the cathode electrode 77 may be a disc-shaped conductive body (e.g. metal), or may be a disc-shaped base (e.g. resin) covered with a conductive material (e.g. metal or carbon fiber material. As an example, the cathode electrode 77 may include carbon fiber and a stainless mesh sandwiching this carbon fiber.

The electronic circuit section 78 houses an electronic circuit that monitors and/or controls the operation (e.g. output voltage or the like) of the microbial fuel cell 7, and may be a connecting member that connects the cathode electrode 77 and the display section 79.

The display section 79 is provided on the other end side of the stake shape, and is mounted on the top portion of the electronic circuit section 78. The display section 79 may display the operational state of the microbial fuel cell 7 (e.g. whether power generation is currently being performed). The display section 79 may include an LED light, a liquid crystal display, and/or the like. The display section 79 may be shaped as a semispherical protrusion, as shown in the drawing, or may instead be shaped as a flat surface.

In the drawing, the electronic circuit section 78 and the display section 79 are shown protruding from the disc-shaped cathode electrode 77, but instead, the electronic circuit section 78 and the display section 79 may be buried in the cathode electrode 77 to be shaped as a single disc along with the cathode electrode 77. In this way, the protruding portion of the microbial fuel cell 7 that protrudes from the ground is made smaller, and it is possible to realize the microbial fuel cell 7 with a simpler design that is in harmony with nature.

As described above, in the microbial fuel cell 7, the length between the anode electrode 71 and the cathode electrode 77 is adjusted by the rod-shaped members such as the first rod-shaped member 73 and the second rod-shaped member 75 provided between the anode electrode 71 and the cathode electrode 77, and the rod-shaped members are connected to the anode electrode 71 and the cathode electrode 77 by the connecting members such as the first connecting member 72, the second connecting member 74, and the third connecting member 76. Furthermore, inside the microbial fuel cell 7, a wire (not shown in the drawing) connected to the anode electrode 71 and an output terminal (not shown in the drawing) and a wire (not shown in the drawing) connected to the cathode electrode 77 and an output terminal (not shown in the drawing) may be provided.

In FIG. 2, there is one anode electrode 71, but the microbial fuel cell 7 may include a plurality of anode electrodes 71. For example, the microbial fuel cell 7 may include a plurality of anode electrodes 71 arranged at different depths, and may select the optimal anode electrode 71 according to the power generation state (e.g. electromotive power or the like). In this case, rod-shaped members and connecting members may be added as needed corresponding to the number of additional anode electrodes 71. In this way, the microbial fuel cell 7 can perform power generation with the anode electrode installed at a depth that is more suitable for power generation.

Figure 3:
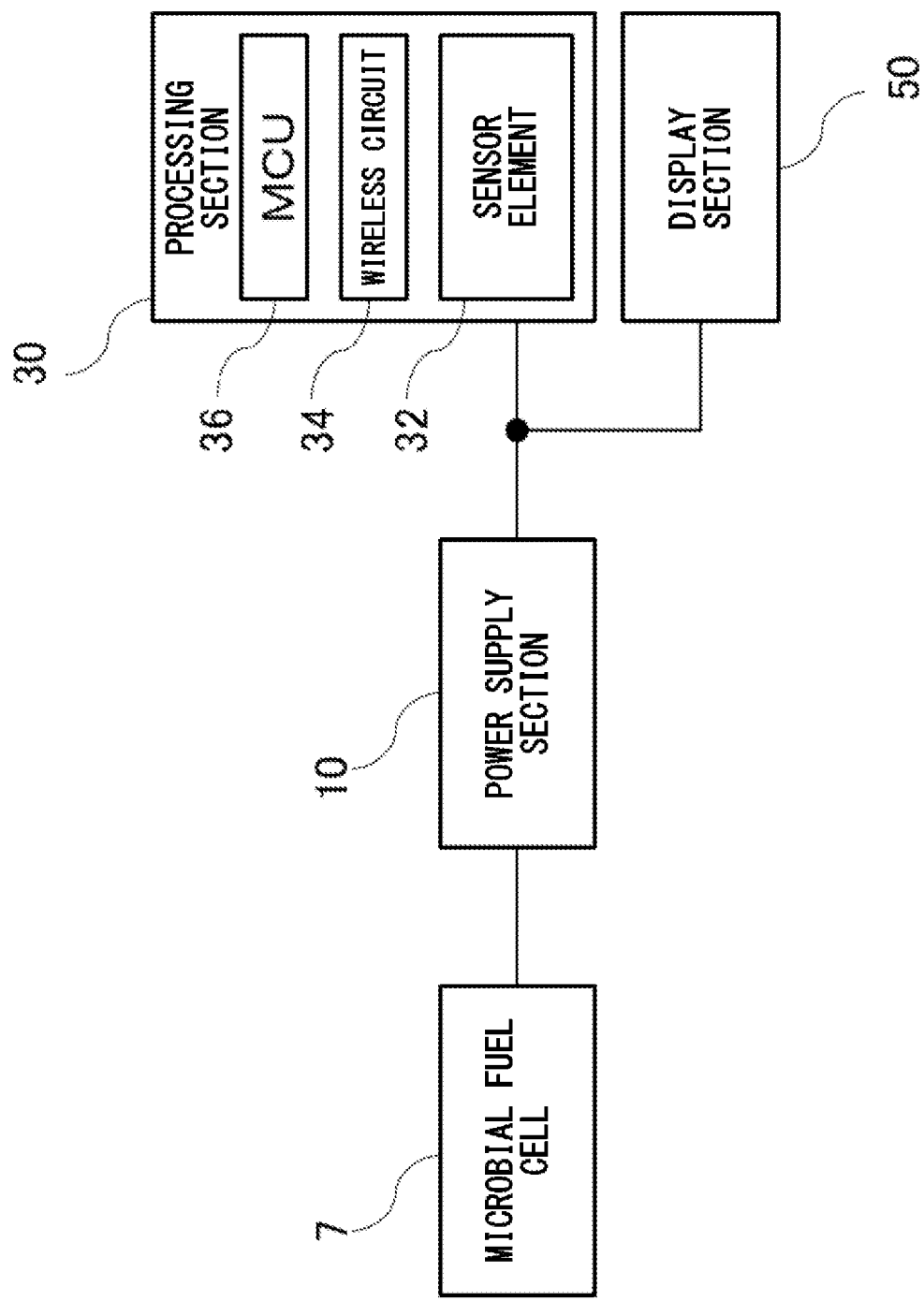
FIG. 3 shows an example of a configuration of the sensor apparatus.

FIG. 3 shows an example of a configuration of the sensor apparatus. The sensor apparatus 5 drives the sensor element using the power from the microbial fuel cell 7, to sense the environmental information. The sensor apparatus 5 includes the microbial fuel cell 7, a power supply section 10, a processing section 30, and a display section 50. The microbial fuel cell 7 may be similar to the microbial fuel cell 7 described in FIG. 2.

The power supply section 10 operates using an input voltage from the microbial fuel cell 7, to boost this input voltage. Furthermore, the power supply section 10 includes a power storage element that stores the power from the microbial fuel cell 7, and supplies power to the processing section 30 and the display section 50. The details of the power supply section 10 are described below.

The processing section 30 acquires power from the power supply section 10 and performs various processes such as the sensing of the environmental information and wireless communication. The processing section 30 includes a sensor element 32, a wireless circuit 34, and an MCU 36.

The sensor element 32 may be an environmental sensor that senses environmental information. For example, the sensor element 32 may sense at least one of temperature, humidity, ultraviolet light amount, visible light amount, carbon dioxide concentration, air pressure, sound pressure, and acceleration as the environmental information. The sensor element 32 may provide the MCU 36 with the sensing results of the environmental information. The sensor element 32 is operated by the power output from the power storage element of the power supply section 10.

The wireless circuit 34 receives the transmission data including the sensing results of the sensor element 32 from the MCU 36, and transmits a signal including this transmission data to the outside of the wireless communication apparatus 8 and the like. The wireless circuit 34 may receive a signal including reception data from outside the wireless communication apparatus 8 and the like, and provide this signal to the MCU 36. The wireless circuit 34 is operated by the power output from the power storage element of the power supply section 10.

The MCU 36 controls operation of the wireless circuit 34. For example, the MCU 36 may receive the sensing results from the sensor element 32, perform signal processing on these sensing results to generate the transmission data including the sensing results, and provide the wireless circuit 34 with this transmission data. The MCU 36 may further control at least a portion of the operations of the power supply section 10, the sensor element 32, and the display section 50. For example, the MCU 36 may receive the reception data from the wireless circuit 34 and control the operation of the power supply section 10 or the sensor element 32 based on this reception data.

The display section 50 displays at least one of the operational state of the sensor element 32 and the state of charge of the power storage element of the power supply section 10. For example, the display section 50 may be a display light that receives an output voltage from the power storage element of the power supply section 10 and lights up with a brightness corresponding to this output voltage. As another example, the display section 50 may be a display light that lights up only when power is being supplied to the sensor element 32. Furthermore, the display section 50 may include a display that displays the sensing results of the sensor element 32 and/or the communication state with the wireless circuit 34.

The sensor apparatus 5 may further include an auxiliary power supply that supplies power to at least a portion of the sensor element 32, the wireless circuit 34, the MCU 36, and the display section 50.

Figure 4:
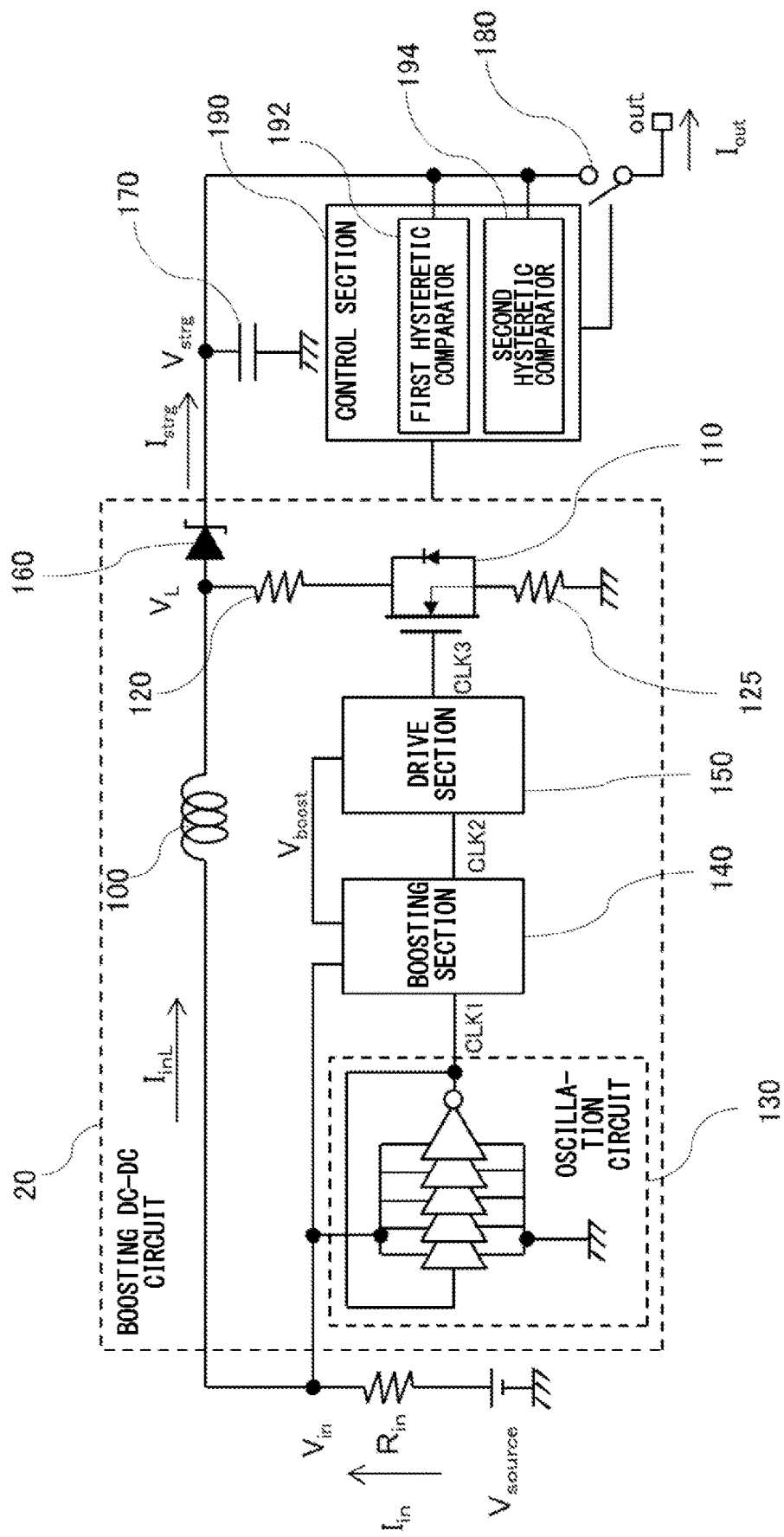
FIG. 4 shows an example of a configuration of the power supply section.

FIG. 4 shows an example of a configuration of the power supply section. The power supply section 10 may be a boosting DC-DC converter that boosts an input voltage $V_{in}$ supplied from the energy harvesting of the microbial fuel cell 7 or the like, and outputs the boosted voltage.

The power supply section 10 includes a boosting DC-DC circuit 20, a power storage element 170, a second switch 180, and a control section 190. The boosting DC-DC circuit 20 is operated by the input voltage from the microbial fuel cell 7 or the like, to amplify an input voltage $V_{source}$ from the microbial fuel cell 7 or the like. The boosting DC-DC circuit 20 includes an inductor 100, a first switch 110, an oscillation circuit 130, a boosting section 140, a drive section 150, a first resistor 120, a second resistor 125, and a diode 160, and stores energy in and releases energy from the inductor 100 according to the switching operation of the first switch 110, thereby boosting the DC input voltage $V_u$ to convert this voltage into DC output voltage. In the power supply section 10 of FIG. 4, the voltage $V_{source}$ supplied from an external input source drops due to the resistor $V_{in}$ inside the power supply section 10 and the current $I_{in}$, such that the input voltage $V_{in}$ is input from the input terminal.

One end of the inductor 100 is connected to the input terminal provided with the input voltage $V_{in}$, and the other end of the inductor 100 is connected to the diode 160 and to the output terminal "out" via the second switch 180. The inductor 100 stores energy caused by the input voltage $V_{in}$ when the first switch 110 is ON, to increase a voltage $V_{strg}$.

The first switch 110 is connected between the inductor 100 and diode 160 and a ground terminal, and the gate terminal is connected to the drive section 150. The first switch 110 is repeatedly turned ON and OFF in an alternating manner, according to a signal CLK3 input to the gate terminal, to control the current between the inductor 100 and the ground terminal. The first switch 110 may be an nMOS, for example.

The first resistor 120 is provided between the inductor 100 and the output terminal "out" and between the inductor 100 and the first switch 110, and is connected to the drain terminal of the first switch 110. The second resistor 125 is provided between the first switch 110 and the ground terminal, and is connected to the source terminal of the first switch 110. The first resistor 120 and the second resistor 125 are used to adjust the current flowing between the drain terminal and the source terminal of the first switch 110.

The oscillation circuit 130 is connected between the input terminal and the inductor 100 and between the input terminal and the boosting section 140, generates an oscillation signal CLK1 corresponding to the input voltage $V_{in}$, and outputs this oscillation signal CLK1 to the boosting section 140. The oscillation circuit 130 generates the oscillation signal CLK1 using the input voltage $V_{in}$ input to the input terminal. The oscillation circuit 130 may generate the oscillation signal CLK1 with an amplitude that is m times (m>0) the input voltage $V_{in}$, and as an example, generates the oscillation signal CLK1 whose amplitude is the input voltage $V_{in}$. The oscillation circuit 130 is a ring oscillation circuit, for example.

The boosting section 140 is connected to the drive section 150, boosts the oscillation signal CLK1 from the oscillation circuit 130 to obtain a signal CLK2 with an amplitude corresponding to the input voltage $V_{in}$, and outputs the boosted signal CLK2 to the drive section 150. The boosting section 140 may perform the boosting with the input voltage $V_{in}$ input thereto and the oscillation signal CLK1, to generate the signal CLK2 to having voltage sufficient for driving the first switch 110. The boosting section 140 may boost the oscillation signal CLK1 whose amplitude is the input voltage $V_{in}$ to generate the signal CLK2 whose amplitude $V_{boost}$ is x times (x>1) the input voltage $V_{in}$. Furthermore, the boosting section 140 may output the voltage $V_{boost}$, obtained by boosting the input voltage $V_{in}$, to the drive section 150.

The drive section 150 causes the first switch 110 to operate according to the signal CLK3 whose amplitude corresponds to the input voltage $V_{in}$. The drive section 150 may change the pulse width of the boosted signal CLK2 output by the boosting section 140, and output the resulting signal as the drive signal CLK3 to the gate of the first switch 110. For example, the drive section 150 may cause the first switch 110 to operate according to the signal CLK3 having a fixed pulse width that is not dependent on the input voltage $V_{in}$, with the same period as the oscillation signal CLK1.

The diode 160 is provided between the inductor 100 and the second switch 180, on the output terminal "out" side of the node to which the first switch 110 is connected. The diode 160 causes the current from the inductor 100 to flow to the output terminal "out", due to the rectification effect.

One end of the power storage element 170 is connected between the diode 160 and the second switch 180, and the other end of the power storage element 170 is connected to the ground terminal. The power storage element 170 stores the power output from the boosting DC-DC circuit 20. The power storage element 170 may be a power storage capacitor or a commercial rechargeable battery. The power storage element 170 is used to store the output current $I_{out}$.

The second switch 180 is connected between the inductor 100 of the boosting DC-DC circuit 20 and the output terminal "out", and is used to control the output of the output voltage $V_{out}$ from the output terminal "out" by being turned ON and OFF by the control section 190.

The control section 190 controls at least one of the operation of the boosting DC-DC circuit 20 and the output of the output voltage $I_{out}$ from the output terminal "out", according to the voltage $V_{strg}$ of the power storage element 170. The control section 190 may perform control to stop or start the switching operation of the first switch 110, by performing control to stop or start the output of the signal CLK from at least one of the oscillation circuit 130, the boosting section 140, and the drive section 150. The control section 190 may directly control the first switch 110, to stop or start the switching operation. Furthermore, the control section 190 may perform control to stop or start the output of the output voltage $V_{out}$ from the output terminal "out", by turning the second switch 180 ON or OFF. The control section 190 includes at least one of a first hysteretic comparator 192 and a second hysteretic comparator 194, to detect the voltage $V_{strg}$ of the power storage element 170.

The first hysteretic comparator 192 is connected between the diode 160 and the output terminal "out", and detects the output voltage $V_{strg}$ from the power storage element 170 in order to control the operation of the boosting DC-DC circuit 20. The first hysteretic comparator 192 may compare the output voltage $V_{strg}$ to two different threshold values, and the control section 190 may control the operation of the boosting DC-DC circuit 20 according to the results of these comparisons.

The second hysteretic comparator 194 is connected between the diode 160 and the output terminal "out", and detects the output voltage $V_{strg}$ from the power storage element 170 in order to control the operation of the second switch 180 and restrict the output from the power storage element 170. The second hysteretic comparator 194 may compare the voltage $V_{strg}$ to two different threshold values, and the control section 190 may control the output of the output voltage $V_{out}$ according to the results of these comparisons. The two threshold values of the second hysteretic comparator 194 may be lower than the two threshold values of the first hysteretic comparator 192. Furthermore, the first hysteretic comparator 192 and the second hysteretic comparator 194 may detect the voltage between the diode 160 and the second switch 180 as the voltage $V_{strg}$ of the power storage element 170.

Figure 5:
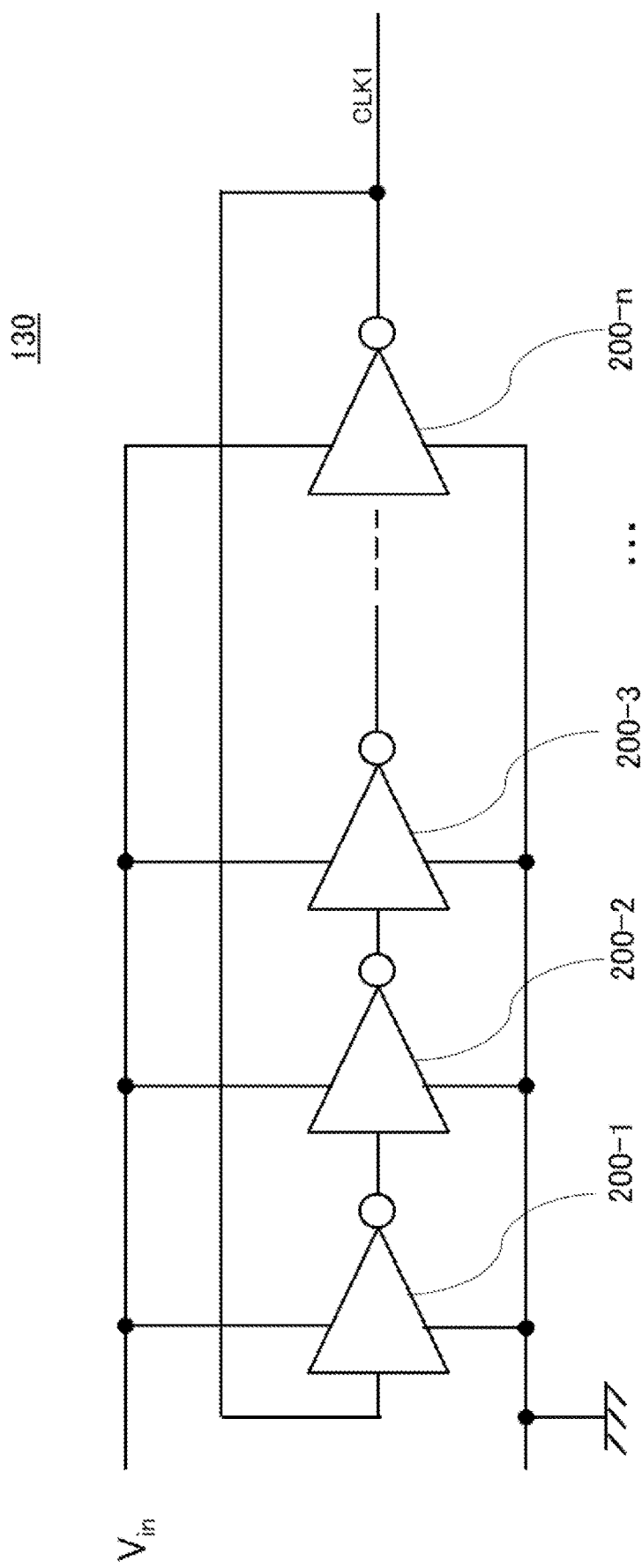
FIG. 5 shows an example of a configuration of the oscillation circuit.

FIG. 5 shows an example of a configuration of the oscillation circuit 130. The oscillation circuit 130 shown in FIG. 5 is a ring oscillation circuit, and includes n (n is an odd number) inverters 200-1 to 200-n connected in series. The output of the inverter 200-n at the final stage is connected to the input of the inverter 200-1 at the first stage.

Figure 6:
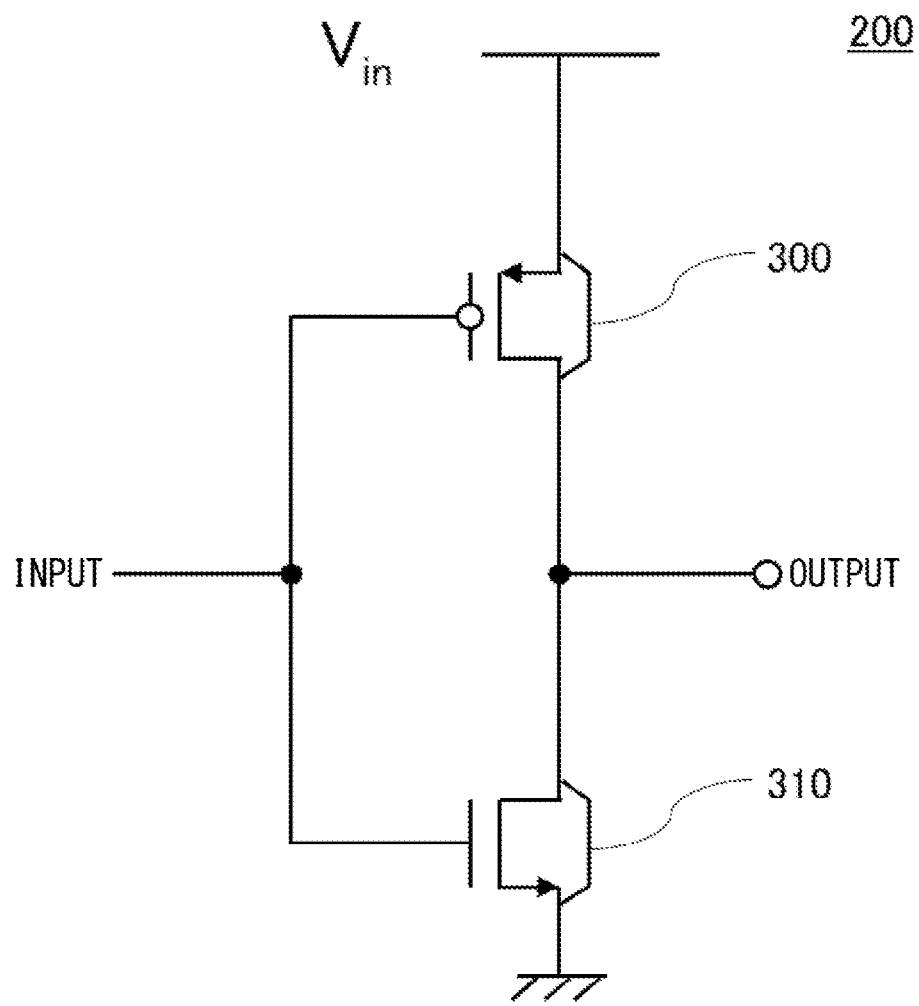
FIG. 6 shows an example of a configuration of one inverter among the plurality of inverters of the oscillation circuit.

FIG. 6 shows an example of a configuration of one inverter 200 among the plurality of inverters 200 of the oscillation circuit 130 shown in FIG. 5. The inverter 200 includes a pMOS switch 300 and an nMOS switch 310, the signal input to the inverter 200 is input to the gate terminals of the pMOS switch 300 and the nMOS switch 310, and the inverter 200 outputs a voltage in response to this signal. The source terminal of the pMOS switch 300 receives the input voltage $V_{in}$, and the output of the source terminal of the nMOS switch 310 is connected to the ground terminal and provided between the drain terminal of the pMOS switch 300 and the drain terminal of the nMOS switch 310.

Figure 7:
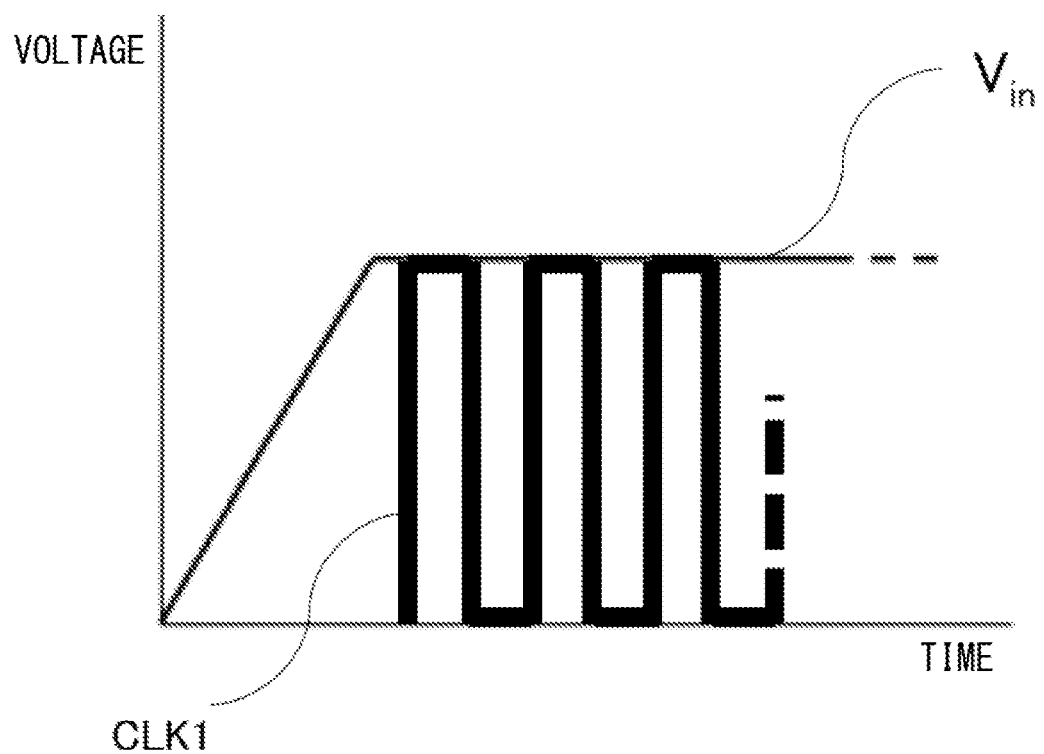
FIG. 7 shows the relationship between the input voltage and the oscillation signal output by the oscillation circuit.

FIG. 7 shows the relationship between the input voltage $V_{in}$ and the oscillation signal CLK1 output by the oscillation circuit 130. The oscillation circuit 130 starts the oscillation operation when the input voltage $V_{in}$ from the input terminal is greater than or equal to a prescribed voltage, and outputs the oscillation signal CLK1 whose amplitude is the input voltage $V_{in}$.

Figure 8:
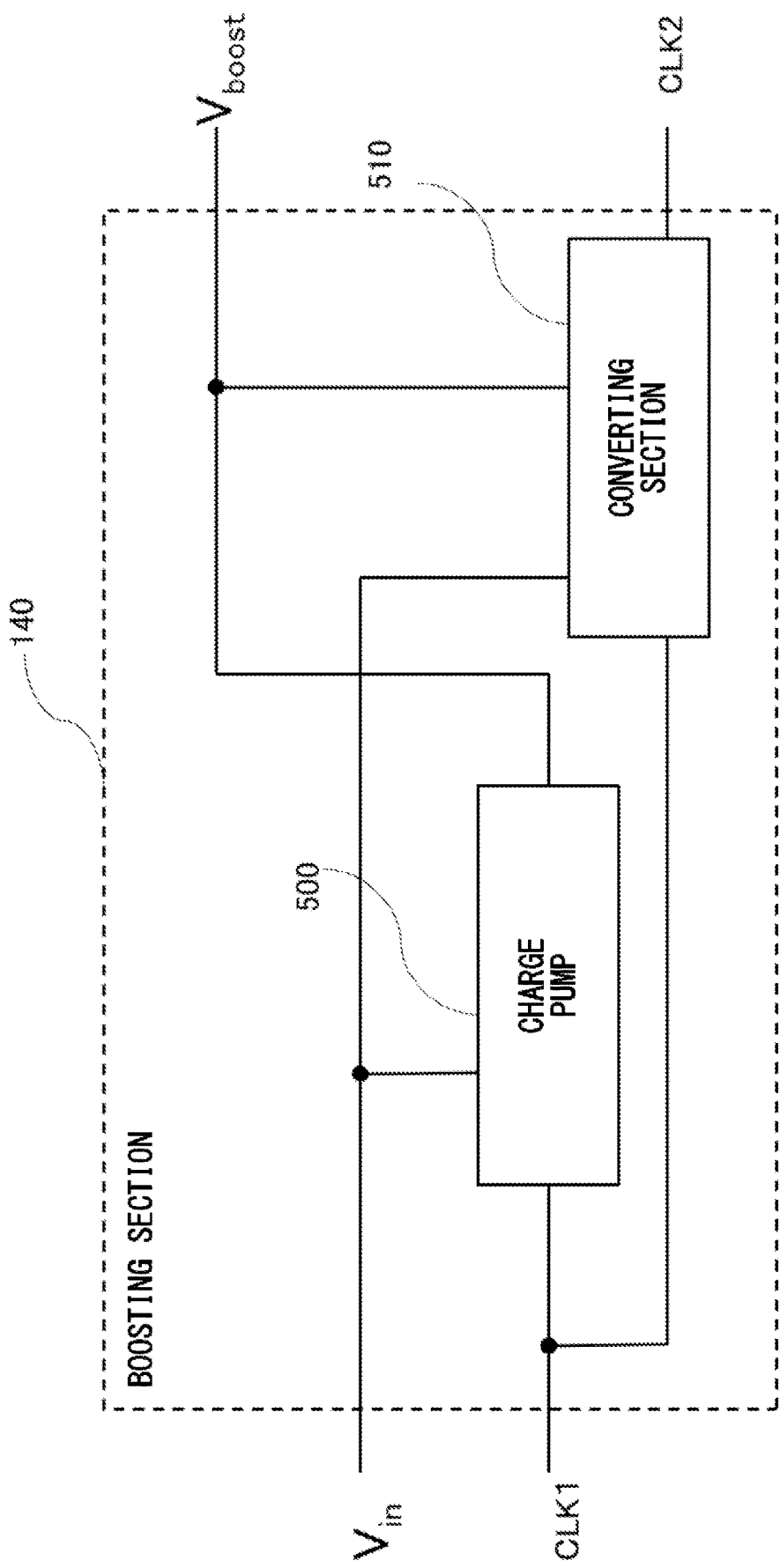
FIG. 8 shows an example of a configuration of the boosting section.

FIG. 8 shows an example of a configuration of the boosting section 140. The boosting section 140 may have a two-input two-output configuration, in which the oscillation signal CLK1 and the input voltage $V_u$ are input thereto, and the signal CLK2 whose amplitude is the boosted voltage $V_{boost}$ and the boosted voltage $V_{boost}$ are output therefrom. The boosting section 140 includes a charge pump 500 and a converting section 510. The charge pump 500 boosts the input voltage $V_{in}$ to obtain the voltage $V_{boost}$. The converting section 510 converts the amplitude (peak value) of the oscillation signal CLK1 input thereto into the voltage $V_{boost}$.

Figure 9:
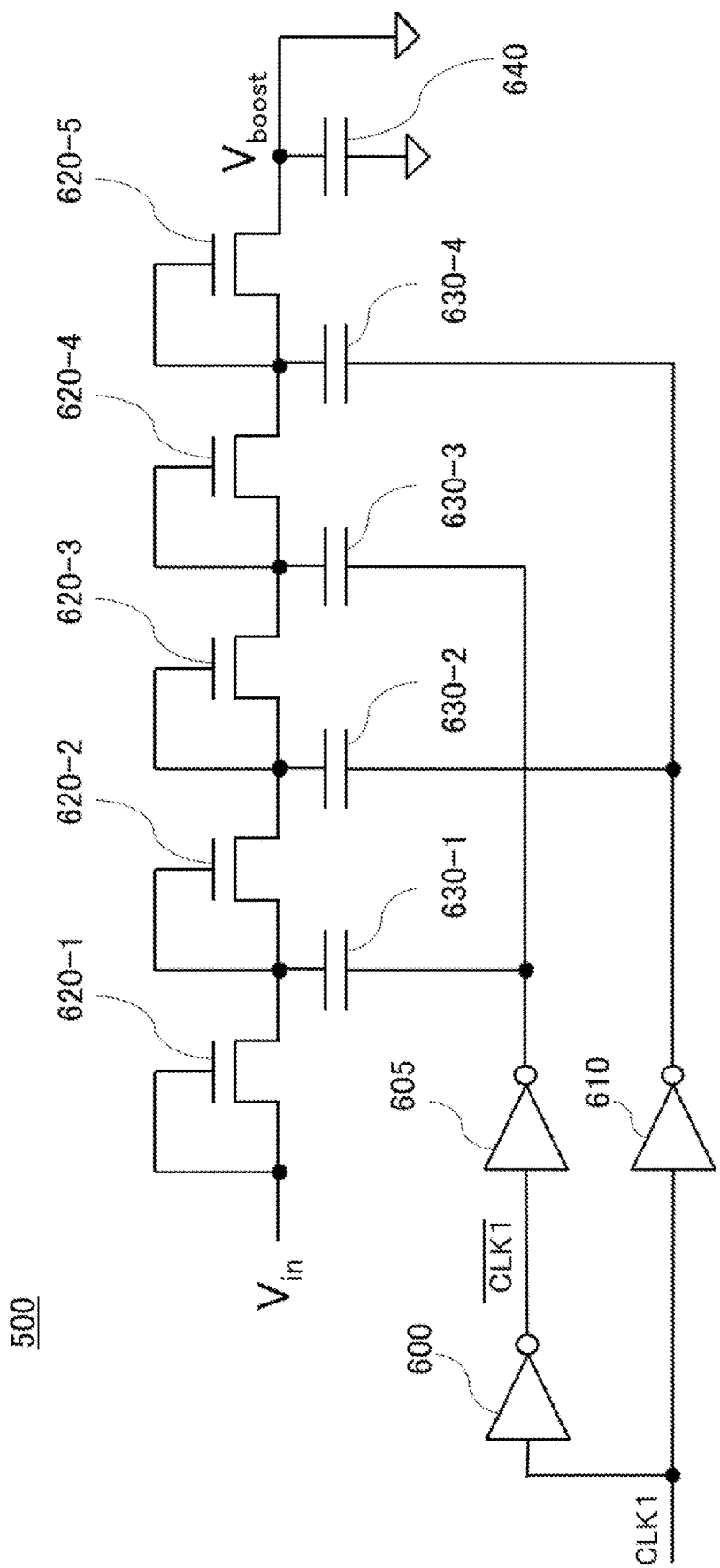
FIG. 9 shows an example of a configuration of the charge pump.

FIG. 9 shows an example of a configuration of the charge pump 500. The charge pump 500 is formed by a CMOS circuit that has a plurality of threshold values including a zero threshold value, and may have a boot strap configuration. The charge pump 500 may include inverters 600, 605, and 610, nMOS switches 620-1 to 620-5 whose drain terminals and gate terminals have diode connections, boosting capacitors 630-1 to 630-4, and a smoothing capacitor 640. The plurality of boosting capacitors 630-1 to 630-4 each have the same capacitance.

The charge pump 500 causes a charge to flow into the boosting capacitors 630-1 to 630-4 via the nMOS switches 620-1 to 620-5, using complementary signals CLK1 and -CLK1 input to the inverters 605 and 610, boosts each node between the nMOS switches 620-1 to 620-5, and outputs the voltage $V_{boost}$ having a voltage value that is x times the input voltage $V_{in}$. For example, in a case where there are only three stages of nMOS switches 620-1 to 620-3, the boosted voltage $V_{boost}$ is $3V_{in}$, and in a case where there are five stages such as shown in FIG. 9, the boosted voltage $V_{boost}$ is $5V_{in}$.

Figure 10:
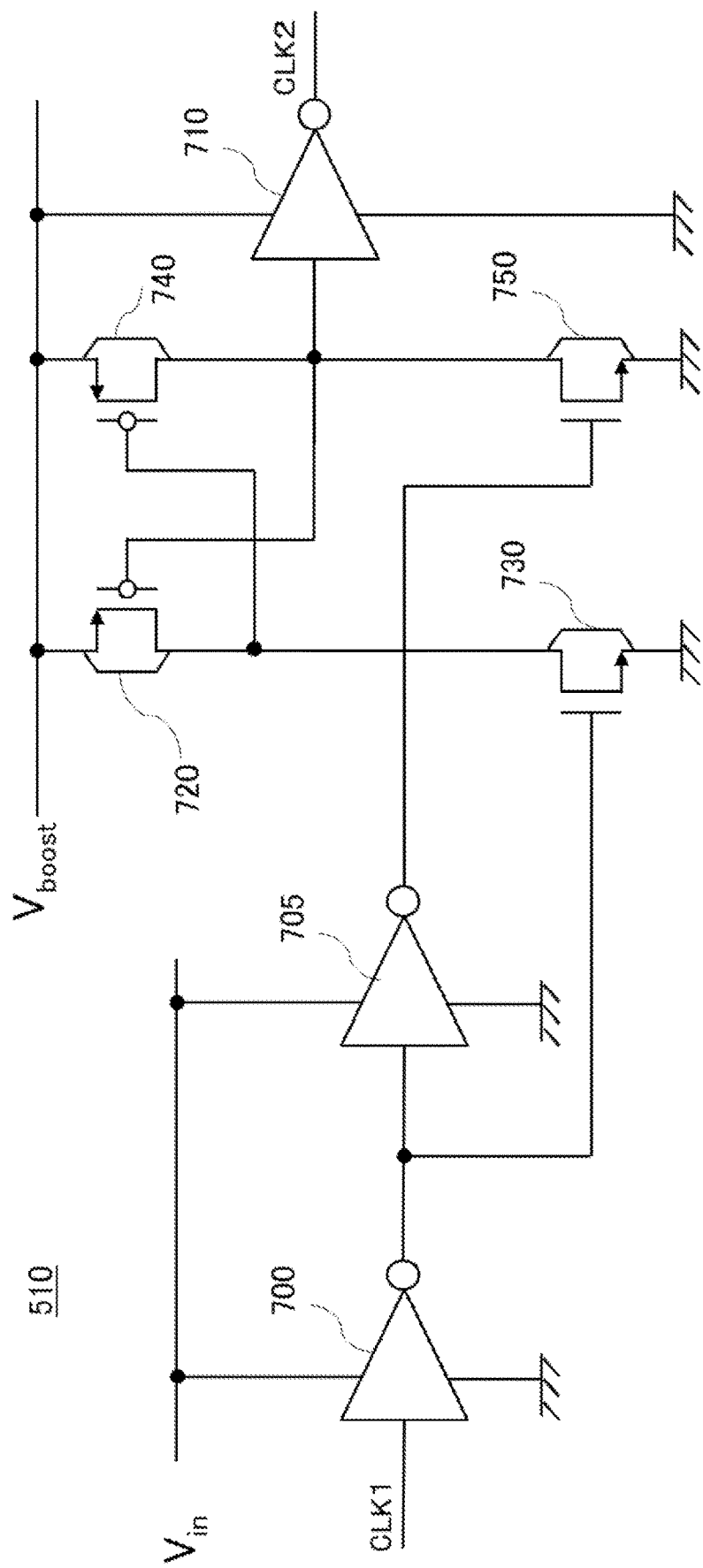
FIG. 10 shows an example of a configuration of the converting section.

FIG. 10 shows an example of a configuration of the converting section 510. The converting section 510 includes a plurality of inverters 700, 705, and 710 and a plurality of MOS switches 720, 730, 740, and 750. The converting section 510 receives the oscillation signal CLK1, the input voltage $V_{in}$, and the voltage $V_{boost}$ from the charge pump 500, and outputs the signal CLK2 whose peak value has been converted from the input voltage $V_{in}$ to the boosted voltage $V_{boost}$. The inverters 700, 705, and 710 may be similar to the inverters shown in FIG. 6.

Figure 11:
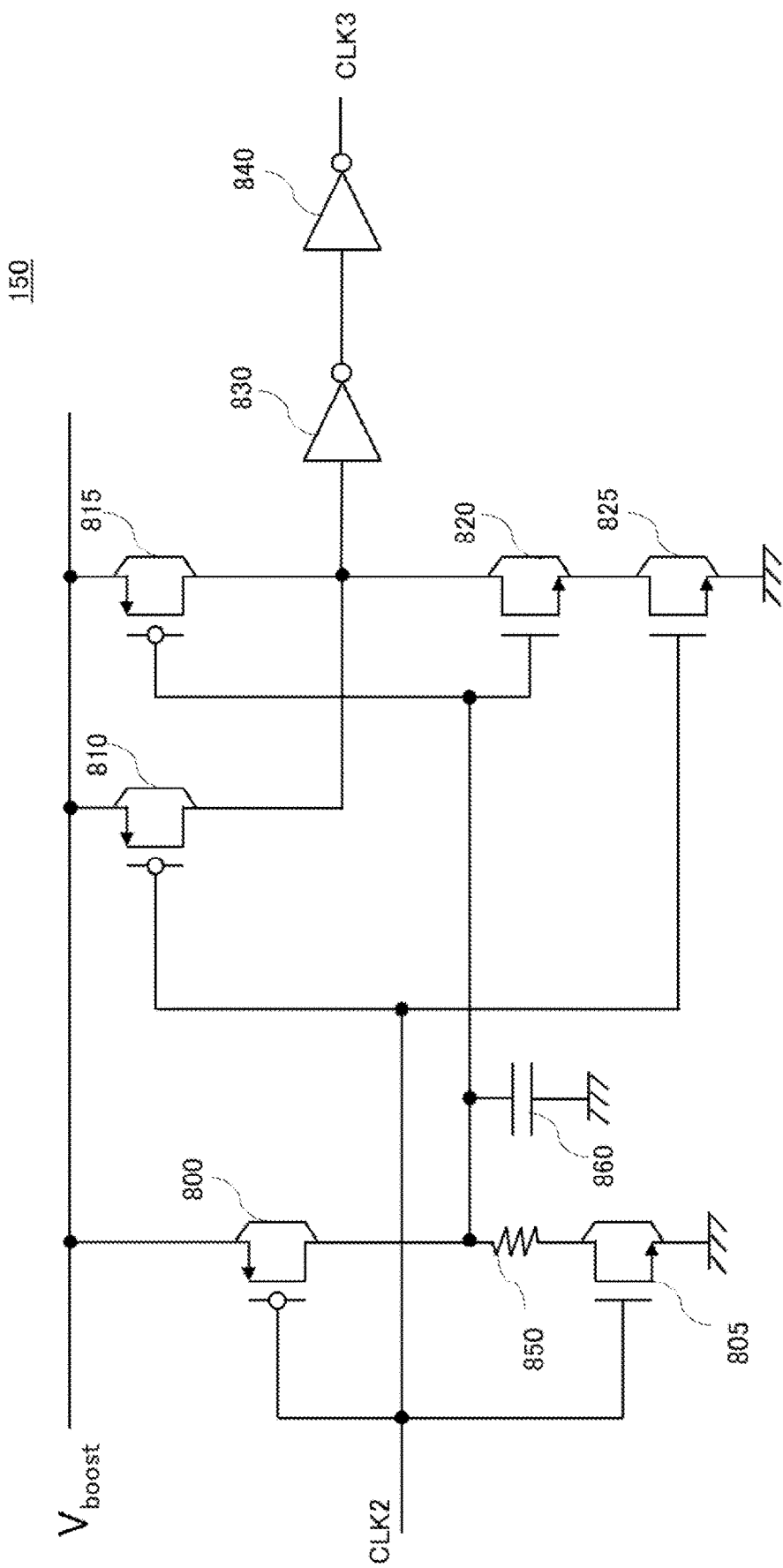
FIG. 11 shows an example of a configuration of the drive section.

FIG. 11 shows an example of a configuration of the drive section 150. The drive section 150 outputs a signal having a fixed high-side pulse width that is not dependent on the input voltage $V_{in}$, for the signal CLK2 boosted by the boosting section 140. The drive section 150 includes a plurality of MOS switches 800, 805, 810, 815, 820, and 825, a plurality of inverters 830 and 840, a resistor 850, and a capacitor 860. The drive section 150 receives the boosted voltage $V_{boost}$ and the signal CLK2, and outputs, as the drive signal CLK3, a signal whose pulse width is fixed according to only the ratio (e.g. a time constant τ of R×C with the rising of the signal as a reference) between the resistance value R of the resistor 850 and the capacitance C of the capacitor 860.

Figure 12:
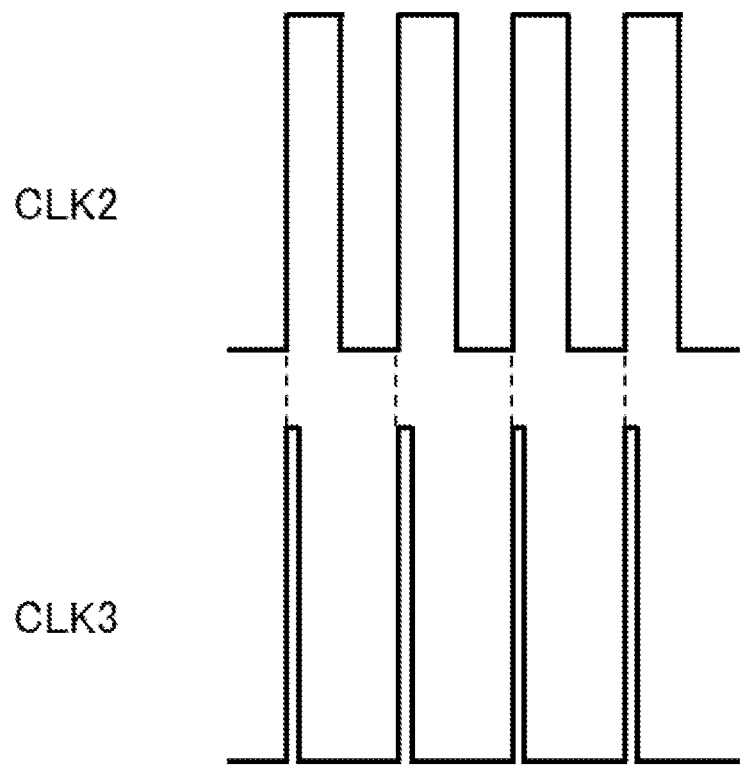
FIG. 12 shows a relationship between the signal CLK2 and the drive signal CLK3 output by the drive section.

FIG. 12 shows a relationship between the signal CLK2 and the drive signal CLK3 output by the drive section 150. The signal CLK2 has a pulse width that depends on the input voltage $V_{in}$ in the oscillation operation of the oscillation circuit 130. On the other hand, the drive signal CLK3 is changed by the drive section 150 from having a pulse width that depends on the input voltage $V_{in}$ to having a fixed pulse width. The drive signal CLK3 has the same period as the signal CLK2, and therefore the risings of these signals are the same, and the pulse width of the drive signal CLK3 may be less than the pulse width of the signal CLK2.

Figure 13:
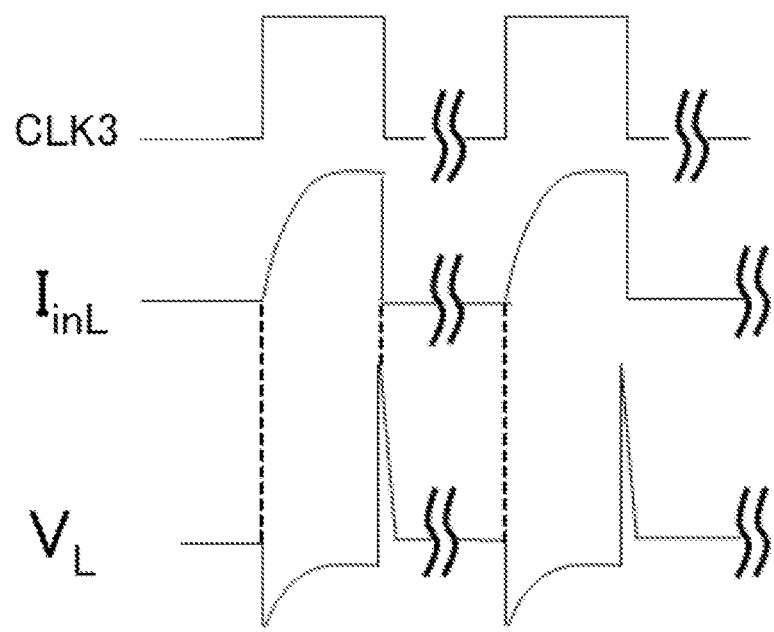
FIG. 13 shows a relationship between the drive signal, a current flowing through the inductor, and a voltage between the inductor and the diode.

FIG. 13 shows a relationship between the drive signal CLK3, a current $I_{inL}$ flowing through the inductor 100, and a voltage $V_L$ between the inductor 100 and the diode 160. The following describes the boosting operation of the power supply section 10 according to the present embodiment.

The power supply section 10 is supplied with the voltage from the input source, and starts the oscillation operation of the oscillation circuit 130 when the input voltage $V_{in}$ reaches a prescribed voltage. The power supply section 10 then boosts the oscillation signal CLK1 with the boosting section 140, and outputs the drive signal CLK3 having an amplitude $V_{boost}$ corresponding to the input voltage $V_u$ to the gate terminal of the first switch 110 from the drive section 150. In FIG. 13, as an example, the first switch 110 is turned ON when the drive signal CLK3 is high and turned OFF when the drive signal CLK3 is low. When the first switch 110 is ON, the current $L_{inL}$ flowing through the inductor 100 flows through the ground terminal via the first switch 110 and has its current value increased. When the first switch 110 is OFF, the current $L_{inL}$ is cut off from flowing through the first switch 110 and instead flows to the output terminal "out" via the diode 160, thereby having its current value drop to a prescribed value.

Furthermore, when the first switch 110 is ON, the voltage $V_L$ generated in the inductor 100 is voltage $V_L = -Ldi/dt$ for the current $I_{inL}$. When the first switch 110 is OFF, the voltage $V_L$ generated in the inductor 100 returns to the same voltage as before the inductor 100 was turned ON.

The power supply section 10 stores the energy in the inductor 100 when the first switch 110 is ON, and when the first switch 110 is turned OFF, outputs the energy with a voltage level exceeding the threshold voltage $V_f$ of the diode 160 for the voltage $V_L$ as the current $I_{strg}$, and this current $I_{strg}$ is stored in the power storage element 170 to become the boosted output voltage $V_{strg}$.

The power supply section 10 according to the present embodiment drives the first switch 110 with the drive signal CLK3 whose amplitude $V_{boost}$ corresponds to the input voltage $V_{in}$. The first switch 110 causes a variable current that depends on the amplitude $V_{boost}$ of the drive signal CLK3 to flow between the drain terminal and the source terminal. Therefore, even when the output resistance of the input source is large and the input voltage $V_{in}$ is low, the power supply section 10 can perform the boosting operation due to feedback that reduces the current flowing through the first switch 110.

Figure 14:
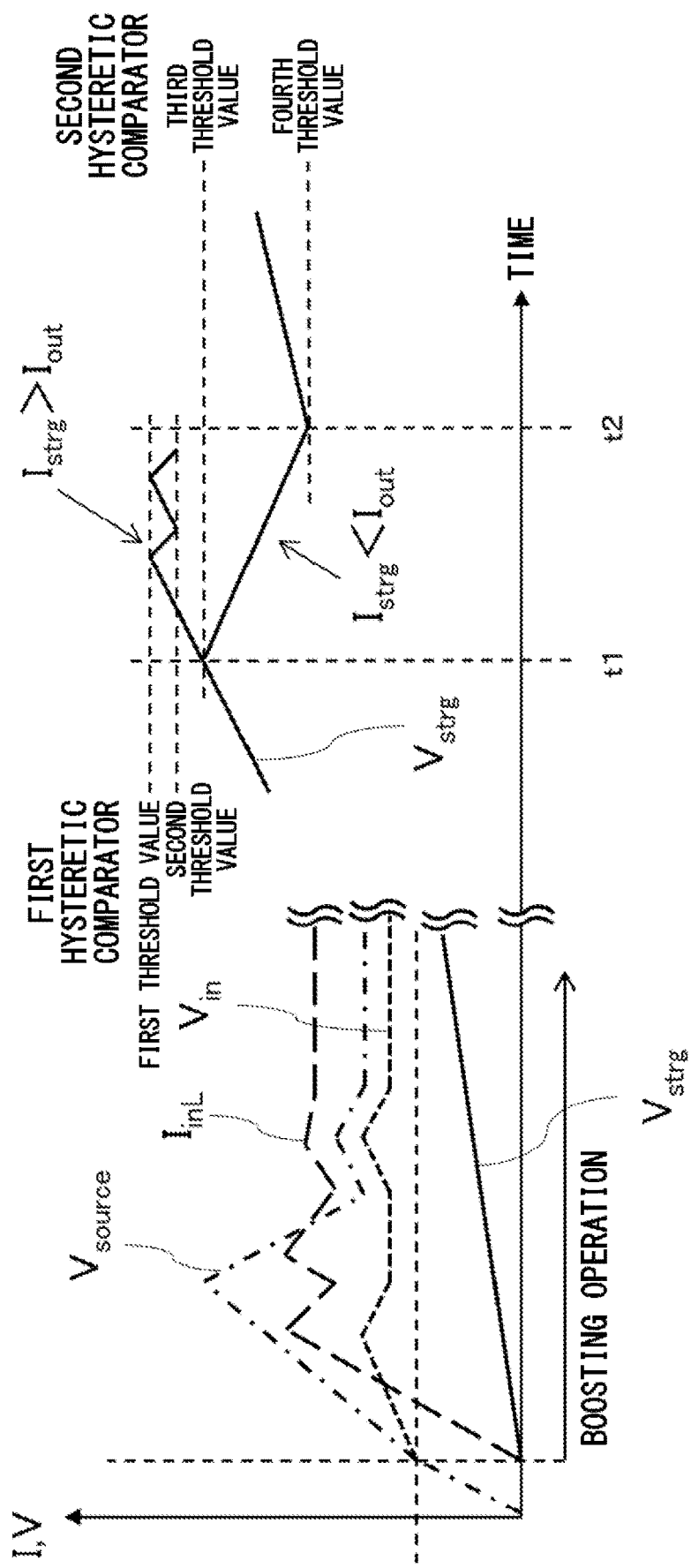
FIG. 14 shows examples of transitions of the voltages and currents in the power supply section.

FIG. 14 shows examples of transitions over time of the voltages and currents in the power supply section 10. The following describes control of the boosting operation performed by the control section 190 of the power supply section 10 according to the present embodiment.

In the power supply section 10, when the supply voltage $V_{source}$ from the input source rises and the input voltage $V_{in}$ input to the input terminal becomes greater than or equal to a prescribed voltage, the oscillation circuit 130 outputs the oscillation signal CLK1 to start the boosting operation by switching the first switch 110 ON and OFF. The power storage element 170 stores the charge due to the boosting operation, from the initial charge state of zero, to increase the voltage $V_{strg}$.

At the timing t1, when the second hysteretic comparator 194 detects that the voltage $V_{strg}$ has become greater than or equal to a third threshold value, the control section 190 turns ON the second switch 180 and starts to output the output voltage $V_{out}$ from the output terminal "out".

After the timing t1, when the output current $I_{out}$ consumed by the system (e.g. a load) is greater than the current $I_{strg}$ stored in the power storage element 170 via the diode 160, the output voltage $V_{out}$ that is being output cannot be maintained, and the voltage value thereof gradually drops. In this case, at the timing t2, when the second hysteretic comparator 194 detects that the voltage $V_{strg}$ of the power storage element 170 has become less than or equal to a fourth threshold value, the control section 190 turns OFF the second switch 180 to stop the output of the output voltage $V_{out}$. Since the boosting operation continues during this time period as well, the voltage $V_{strg}$ of the power storage element 170 rises again, and the control section 190 restarts the output of the output voltage $V_{out}$ when the output voltage $V_{strg}$ becomes greater than or equal to the third threshold value.

On the other hand, after the timing t1, when the output current $I_{out}$ is less than the current $I_{strg}$ stored in the power storage element 170 via the diode 160, the output voltage $V_{strg}$ of the power storage element 170 continues to rise. In this case, when the first hysteretic comparator 192 detects that the voltage $V_{strg}$ of the power storage element 170 has become greater than or equal to a first threshold value, the control section 190 stops the operation of the boosting DC-DC circuit 20 by stopping the switching operation of the first switch 110. Due to this, the voltage $V_{strg}$ of the power storage element 170 gradually drops. Furthermore, by providing the first threshold value, it is possible to prevent breakdown caused by the voltage being greater than or equal to the withstand voltage standard of the power storage element 170 or the sensor apparatus 5.

After the switching operation is stopped, when the first hysteretic comparator 192 detects that the voltage $V_{strg}$ of the power storage element 170 has become less than or equal to a second threshold value, the control section 190 starts the operation of the boosting DC-DC circuit 20 by starting the switching operation of the first switch 110. In this way, even when the output current $I_{out}$ is less than the current $L_{strg}$ stored in the power storage element 170 via the diode 160, the control section 190 can control the voltage $V_{strg}$ of the power storage element 170 to be between the first threshold value and the second threshold value.

The power supply section 10 according to the present embodiment can restrict current consumption and perform highly accurate DC-DC conversion with low power and a simple configuration, without needing complex control such as PWM as in the conventional art. The power supply section 10 is a hysteresis comparator of the control section 190 that can determine that the voltage $V_{strg}$ of the power storage element 170 is within a prescribed level range and output this voltage $V_{strg}$.

Figure 15:
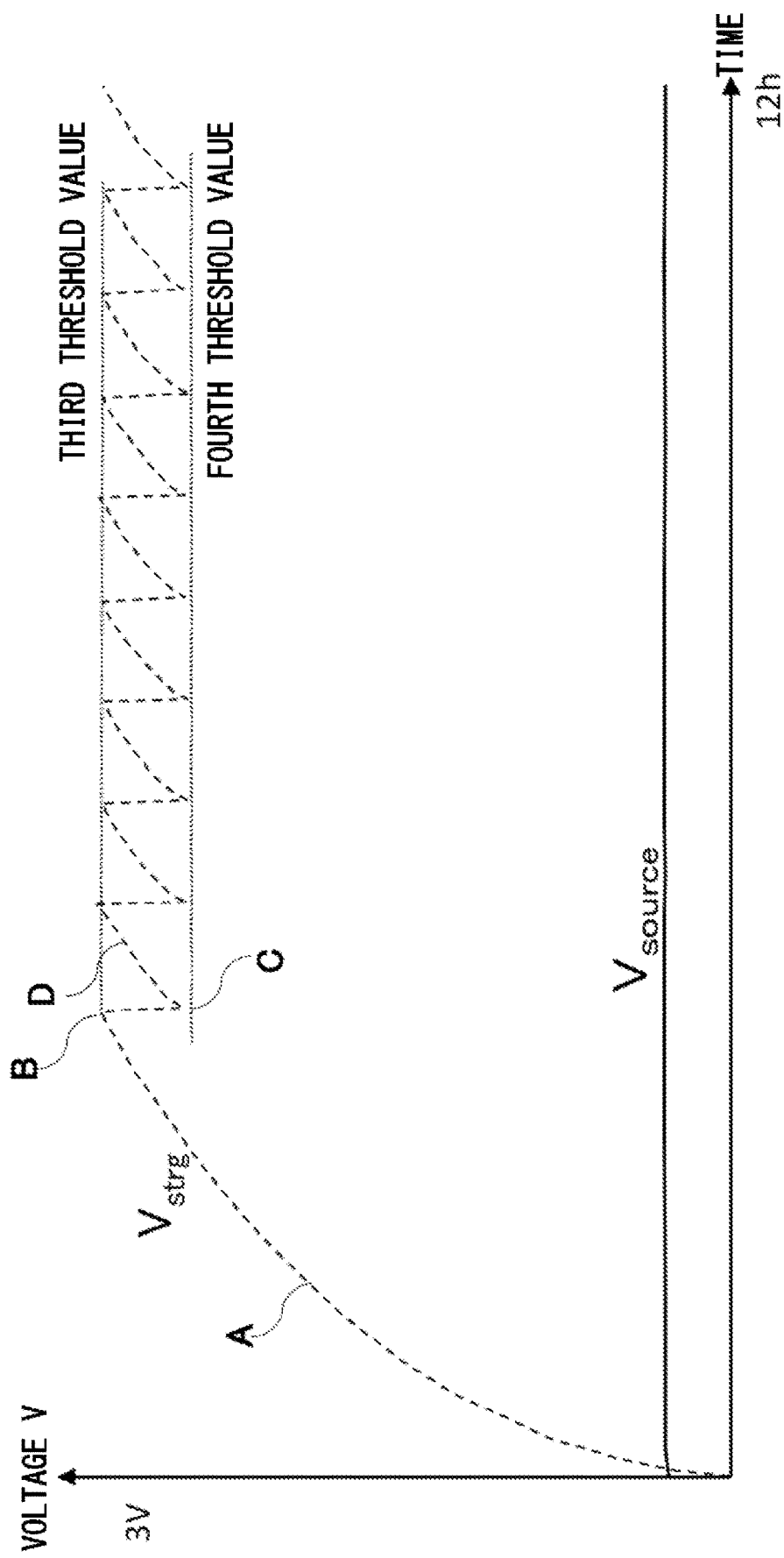
FIG. 15 shows examples of voltage transitions in the power supply section.

FIG. 15 shows voltage transitions in the power supply section. FIG. 15 shows transitions from when the supply of power from the microbial fuel cell 7 starts. The supply voltage $V_{source}$ from the microbial fuel cell 7 shown by the solid line is approximately constant over time. Therefore, the power storage element 170 receives a supply of stable power from the microbial fuel cell 7 and gradually stores this power (shown by A in the drawing). As a result, the voltage $V_{strg}$ of the power storage element 170 gradually increases from when the power supply starts, according to the progress of the storage in the power storage element 170.

When the voltage $V_{strg}$ of the power storage element 170 reaches the third threshold value (shown by B in the drawing), the supply of power from the power storage element 170 to the processing section 30 and the display section 50 starts. Therefore, the processing section 30 and the sensor element 32 perform the sensing of the environmental information such as temperature and humidity, and the wireless circuit 34 transmits the sensing results. Due to the processing section 30 consuming power, the amount of power stored in the power storage element 170 decreases, and the output voltage $V_{strg}$ drops. When the output voltage $V_{strg}$ falls below the fourth threshold value (shown by C in the drawing), the supply of power from the power storage element 170 is stopped. Therefore, the operation of the sensor element 32, the wireless circuit 34, and the like also stops.

When the storage in the power storage element 170 progresses again and the voltage $V_{strg}$ reaches the third threshold value (shown by D in the drawing), the supply of power from the power storage element 170 to the processing section 30 and the display section 50 is started. In this way, in the sensor apparatus 5, storing time periods (A and D in the drawing) of the power storage element 170 and operating time periods (the time periods between B and C in the drawing) of the processing section 30 and the like are repeated in an alternating manner. The processing section 30 and the like cannot operate using only the supply voltage $V_{source}$ from the microbial fuel cell 7, but according to the sensor apparatus 5, it is possible to efficiently store power from the microbial fuel cell 7 and cause the processing section 30 and the like to operate.

In one embodiment, during one operation time period, the wireless circuit 34 may transmit the sensing results of the sensor element 32 a plurality of times. In this way, the wireless communication apparatus 8 and the like can reliably receive the sensing results. Furthermore, in the present embodiment, during the operation time periods, the wireless circuit 34 may continue transmitting the sensing results of the sensor element 32 even when the output voltage $V_{strg}$ has dropped below the fourth threshold value, until receiving an Ack from the wireless communication apparatus 8. For example, a low value is set in advance as the fourth threshold value, and after receiving an Ack, the MCU 36 may raise up the fourth threshold value of the second hysteretic comparator 194 to be a high value. As an example, the MCU 36 may change a threshold value of the second hysteretic comparator 194 by switching a switch in a circuit path of the second hysteretic comparator 194 to change the resistor that affects the threshold voltage.

In the present embodiment, the sensor apparatus 5 may change the third threshold value and/or the fourth threshold value, according to the sensing results of the sensor element 32. For example, the MCU 36 may lower the third threshold value and/or raise the fourth threshold value of the second hysteretic comparator 194, in response to a difference (e.g. a temperature difference) between the newest sensing result and the previous sensing result being greater than or equal to a threshold value. In this way, it is possible to shorten the sensing interval when there is a large amount of fluctuation in the sensing results, thereby causing the sensor element 32 to acquire more specific fluctuation information concerning the environmental information. Furthermore, the MCU 36 may transmit a notification or a warning to the wireless communication apparatus 8 or the like when the difference between sensing results is greater than or equal to the threshold value.

In the manner described above, according to the sensor system 1 of the present embodiment, the sensor apparatus 5 can sense the environmental information with the sensor element 32 and transmit the sensing results with the wireless circuit 34, by using the boosting DC-DC circuit 20 and the like to efficiently amplify the output voltage obtained from the microbial fuel cell 7 and using this amplified voltage. In this way, the sensor system 1 can realize a stable network of environmental information sensors that is independently established and does not need a supply of power from the outside.

Figure 16:
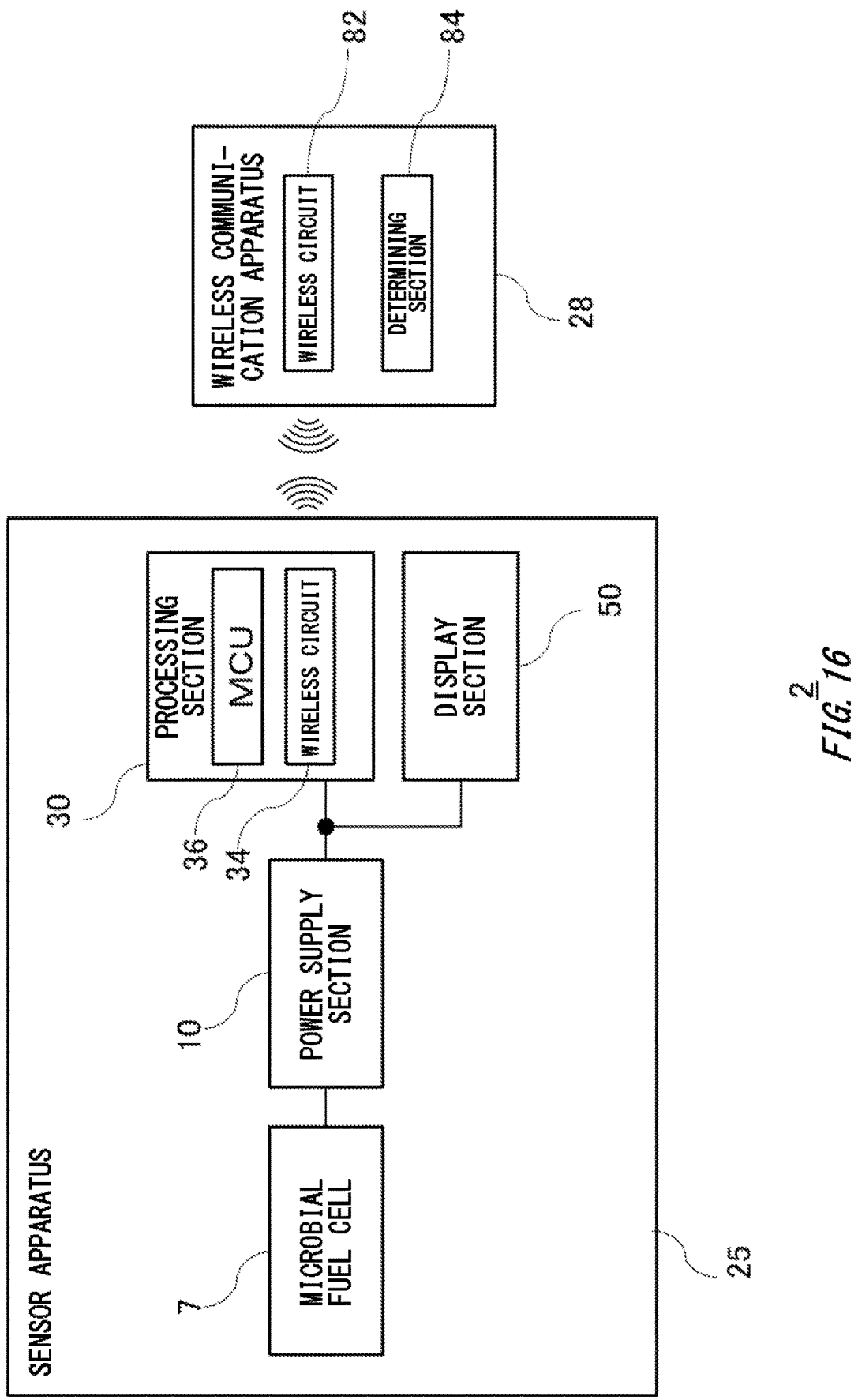
FIG. 16 shows an example of a configuration of a sensor system according to a modification of the present embodiment.

FIG. 16 shows an example of a configuration of a sensor system 2 according to a modification of the present embodiment. The sensor system 2 of the present modification receives a supply of power from the energy harvesting power supply. The following mainly describes a case in which the energy harvesting power supply is the microbial fuel cell 7. The sensor system 2 senses a state (e.g. a state of soil in the ground, such as microorganism activity level) of the energy harvesting power supply, and transmits this state to the outside. The sensor system 2 includes a sensor apparatus 25 and a wireless communication apparatus 28.

The sensor apparatus 25 includes the energy harvesting power supply such as the microbial fuel cell 7, the power supply section 10, the processing section 30, and the display section 50. The microbial fuel cell 7, the power supply section 10, the processing section 30, and the display section 50 may have similar configurations and functions as the corresponding components described in relation to the sensor apparatus 5 in FIG. 3 and the like. In the following, there are cases where descriptions of items in the present modification similar to those of the sensor apparatus 5 are omitted.

The processing section 30 operates using the power supplied from the power supply section 10, and includes the wireless circuit 34 and the MCU 36. As shown in the drawing, the processing section 30 of the sensor apparatus 25 differs from the sensor apparatus 5 in that the sensor apparatus 25 does not need to include the sensor element 32. Instead, the processing section 30 may include the sensor element 32 shown in FIG. 3.

The wireless circuit 34 may have a configuration and function similar to those of the wireless circuit 34 described in FIG. 3. The wireless circuit 34 wirelessly transmits signals to the wireless communication apparatus 28, according to the state of the power supply from the power supply section 10. For example, the wireless circuit 34 may perform wireless transmission every time a supply of power is received from the power storage element of the power supply section 10. Accordingly, the wireless circuit 34 performs wireless transmission a number of times, or with a frequency, corresponding to the power supply from the power supply section 10. Therefore, the sensor apparatus 25 indirectly transmits the state of the energy harvesting power supply such as the microbial fuel cell 7 to the wireless communication apparatus 28. The wireless circuit 34 may provide the MCU 36 with data included in the signals received from the wireless communication apparatus 28 and the like.

The MCU 36 controls the operation of the wireless circuit 34. For example, the MCU 36 may generate transmission data having an advertising channel format such as Bluetooth Low Energy (Registered Trademark) and provide the wireless circuit 34 with this transmission data. The MCU 36 may control the display of the display section 50 based on the data received from the wireless communication apparatus 28 and the like.

The display section 50 displays the state of charge of the power storage element of the power supply section 10 and/or the data received from the wireless communication apparatus 28. For example, the display section 50 may be a display light that receives an output voltage from the power storage element of the power supply section 10 and lights up with a brightness corresponding to this output voltage. As another example, the display section 50 may be a display light that lights up only when power is being supplied to the wireless circuit 34. Furthermore, the display section 50 may include a display that displays the communication state with the wireless circuit 34.

The wireless communication apparatus 28 includes a wireless circuit 82 and a determining section 84. The wireless communication apparatus 28 may have a configuration and function similar to those of the wireless communication apparatus 8 described in relation to the wireless communication apparatus 8 in FIG. 1 and the like. In the following, there are cases where descriptions of items in the present modification similar to those of the wireless communication apparatus 8 are omitted.

The wireless circuit 82 receives a signal including data transmitted from the wireless circuit 34, and provides the determining section 84 with this signal. The wireless circuit 82 may transmit determination results acquired from the determining section 84 to the outside, such as to the wireless communication apparatus 8 having a data relay function described in FIG. 1, another wireless communication apparatus 28, or another communication apparatus. Furthermore, the wireless circuit 82 may receive data from the outside, and provide this data to the determining section 84 or transmit this data to the wireless circuit 34.

The determining section 84 determines the state of the energy harvesting power supply such as the microbial fuel cell 7. For example, the determining section 84 determines the state of the energy harvesting power supply based on the signal received by the wireless circuit 82 from the wireless circuit 34. Specifically, the determining section 84 may determine the state based on any one of the number of times the signal is received, how frequently the signal is received, the strength of the signal, the interval of the signal, and the signal frequency. As an example, the determining section 84 may determine that the state of the energy harvesting power supply is a first state if the same one of the number of times a data signal is received (i.e. how frequently the signal is received), the signal strength, the signal interval, and the signal frequency within a unit time period or within a predetermined time frame is greater than or equal to a predetermined threshold value, and may determine that the state of the energy harvesting power supply is the second state if any one of these values is less than the predetermined threshold value. Here, the first state may be a state in which the energy harvesting power supply is healthy (e.g. a state in which the activity of the microorganisms of the microbial fuel cell 7 is favorable). The second state may be a state in which the energy harvesting power supply is not healthy (e.g. a state in which the activity of the microorganisms of the microbial fuel cell 7 is poor). The determining section 84 may make a determination that divides the state of the energy harvesting power supply into three or more stages.

In this way, in the present modification, the sensor apparatus 25 transmits the signal to the wireless communication apparatus 28 a certain number of times, with a certain frequency, or the like corresponding to the state of the energy harvesting power supply, and the wireless communication apparatus 28 determines the state of the energy harvesting power supply. In this way, for example, the sensor system 2 can sense the activity level of the microorganisms in the soil without being provided with an external power supply or sensor element, and can constantly monitor this activity level. As an example, the sensor system 2 may be implemented in a river, in which case the sensor system 2 can constantly monitor pollution in the river. In the present modification, another energy harvesting power supply may be used instead of the microbial fuel cell 7. Furthermore, a boosting circuit other than the boosting DC-DC circuit may be used in the power supply section 10.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

LIST OF REFERENCE NUMERALS

1: sensor system, 2: sensor system, 5: sensor apparatus, 7: microbial fuel cell, 8: wireless communication apparatus, 9: terminal, 10: power supply section, 20: boosting DC-DC circuit, 25: sensor apparatus, 28: wireless communication apparatus, 30: processing section, 32: sensor element, 34: wireless circuit, 36: MCU, 50: display section, 70: tip portion, 71: anode electrode, 72: first connecting member, 73: first rod-shaped member, 74: second connecting member, 75: second rod-shaped member, 76: third connecting member, 77: cathode electrode, 78: electronic circuit section, 79: display section, 82: wireless circuit, 84: determining section, 100: inductor, 110: first switch, 120: first resistor, 125: second resistor, 130: oscillation circuit, 140: boosting section, 150: drive section, 160: diode, 170: power storage element, 180: second switch, 190: control section, 192: first hysteretic comparator, 194: second hysteretic comparator, 200: inverter, 300: pMOS switch, 310: nMOS switch, 500: charge pump, 510: converting section, 600: inverter, 605: inverter, 610: inverter, 620: nMOS switch, 630: boosting capacitor, 640: smoothing capacitor, 700: inverter, 705: inverter, 710: inverter, 720: MOS switch, 730: MOS switch, 740: MOS switch, 750: MOS switch, 800: MOS switch. 805: MOS switch, 810: MOS switch, 815: MOS switch, 820: MOS switch, 825: MOS switch, 830: inverter, 840: inverter, 850: resistor, 860: capacitor

What is claimed is:

1. A sensor system comprising:
an energy harvesting power supply;
a power supply section; wherein the power supply section includes:
   a boosting circuit that is operated by an input voltage from the energy harvesting power supply and boosts the input voltage;
   a power storage element that stores power output from the boosting circuit;
   a first hysteretic comparator that detects an output voltage from the power storage element, to control operation of the boosting circuit; and
   a second hysteretic comparator that detects the output voltage from the power storage element to control operation of a switch that is connected between the power storage element and an output terminal of the boosting circuit;
a first wireless circuit that wirelessly transmits a signal, according to power output from the power storage element;
a second wireless circuit that receives the signal transmitted from the first wireless circuit; and
a determining section that determines a state of the energy harvesting power supply, based on the signal received by the second wireless circuit.

2. The sensor system according to claim 1, wherein when the first hysteretic comparator detects that the output voltage has become greater than or equal to a first threshold value, operation of the boosting circuit is stopped, and later, when the first hysteretic comparator detects that the output voltage has become less than or equal to a second threshold value, operation of the boosting circuit is started.

3. The sensor system according to claim 2, wherein when the second hysteretic comparator detects that the output voltage has become greater than or equal to a third threshold value, the switch is turned ON and output of the output voltage is started, and later, when the second hysteretic comparator detects that the output voltage has become less than or equal to a fourth threshold value, the switch is turned OFF and the output of the output voltage is stopped.

4. The sensor system according to claim 3, further comprising;
a sensor element that is operated by the power output from the power storage element and outputs a sensing result to acquire more specific fluctuation information of environmental information; and
a calculation unit changes the third threshold value and/or the fourth threshold value, according to the sensing result.

5. The sensor system according to claim 4, wherein
the signal includes the sensing result, and
the first wireless circuit transmits the signal including the sensing result to the second wireless circuit.

6. The sensor system according to claim 4, wherein
the calculation unit lowers the third threshold value and/or raises the fourth threshold value of the second hysteretic comparator, in response to a difference between the newest sensing result and the previous sensing result being greater than or equal to a threshold value.

7. The sensor system according to claim 6, wherein
the calculation unit is further configured to transmit a notification or a warning to the first wireless circuit when the difference is greater than or equal to the threshold value.

8. The sensor system according to claim 3, wherein
the second threshold value is larger than the third threshold value.

9. The sensor system according to claim 4, wherein
the first wireless circuit continues transmitting the signal without stopping the output of the output voltage even when the output voltage from the power storage element has dropped below the fourth threshold value, until the first wireless circuit receives an Ack from the second wireless circuit.

10. The sensor system according to claim 9, wherein
when the first wireless circuit receives the Ack from the second wireless circuit, the calculation unit changes the fourth threshold value to a value larger than the fourth threshold value.

11. The sensor system according to claim 1, wherein
the determining section determines the state based on any one of how frequently the signal is received, strength of the signal, an interval between signals, and frequency of the signal.

12. The sensor system according to claim 11, wherein
the determining section determines the state to be a first state if any one of how frequently the signal is received, the strength of the signal, the interval between signals, and the frequency of the signal is greater than or equal to a predetermined threshold value, and determines the state to be a second state if the same one of how frequently the signal is received, the strength of the signal, the interval between signals, and the frequency of the signal is less than the predetermined threshold value.

13. The sensor system according to claim 12, wherein
the first state is a state in which the energy harvesting power supply is healthy, and the second state is a state in which the energy harvesting power supply is not healthy.

14. The sensor system according to claim 1, wherein
the first wireless circuit continues transmitting the signal until the first wireless circuit receives an Ack from the second wireless circuit.

* * * * *